United States Patent [19]

Smith et al.

[11] Patent Number: 5,075,885
[45] Date of Patent: Dec. 24, 1991

[54] ECL EPROM WITH CMOS PROGRAMMING

[75] Inventors: Douglas D. Smith; Robert A. Kertis, both of Puyallup; Terrance L. Bowman, Sumner, all of Wash.

[73] Assignee: National Semiconductor Corporation, Santa Clara, Calif.

[21] Appl. No.: 287,980

[22] Filed: Dec. 21, 1988

[51] Int. Cl.⁵ .............................................. G11C 7/00
[52] U.S. Cl. ............................ 365/189.05; 365/208; 365/225.6; 307/495
[58] Field of Search ................ 365/177, 189.01, 225.6, 365/189.05, 230.08, 207, 208; 357/43; 307/494, 495, 530

[56] References Cited

U.S. PATENT DOCUMENTS

| | | | |
|---|---|---|---|
| 4,825,413 | 4/1989 | Tran | 365/177 |
| 4,858,183 | 8/1989 | Scharrer | 365/156 |
| 4,866,673 | 9/1989 | Higuchi et al. | 365/177 |
| 4,879,681 | 11/1989 | Miwa et al. | 365/189.01 |
| 4,924,439 | 5/1990 | Ogiue et al. | 365/189.05 |

Primary Examiner—James W. Moffitt
Attorney, Agent, or Firm—Lee Patch; Robert C. Colwell; Paul C. Haughey

[57] ABSTRACT

The present invention provides an ECL EPROM circuit which uses a MOS memory cell. The invention includes a technique for programming the memory cell using MOS voltage levels, and also includes circuitry for reading the memory cell at ECL voltage levels. Thus, the programming and reading paths are split to give the ease of programming and the reprogrammability of MOS EPROM devices combined with the reading speed of PROM devices using ECL voltage levels. In one embodiment, two parallel paths are provided to a memory cell to enable it to separately receive reading and writing (programming) signals. The reading path employs ECL components for reading the cell, while the writing path contains MOS components for programming and verifying the cell. The memory cell itself contains a MOS memory element, an ECL pass element, and a sense element coupling the MOS memory element to the ECL pass element. The MOS memory element is coupled to the programming (writing) path, and the ECL pass element is coupled to the read path with a bipolar output transistor.

26 Claims, 11 Drawing Sheets

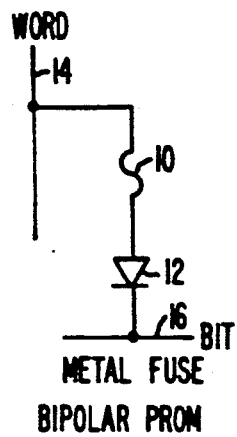
FIG._1.
METAL FUSE
BIPOLAR PROM
PRIOR ART
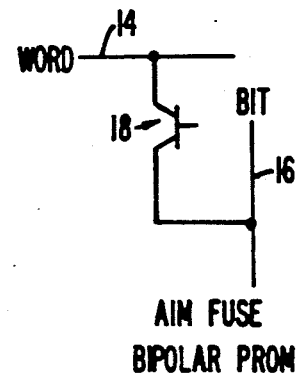
FIG._2.
AIM FUSE
BIPOLAR PROM
PRIOR ART
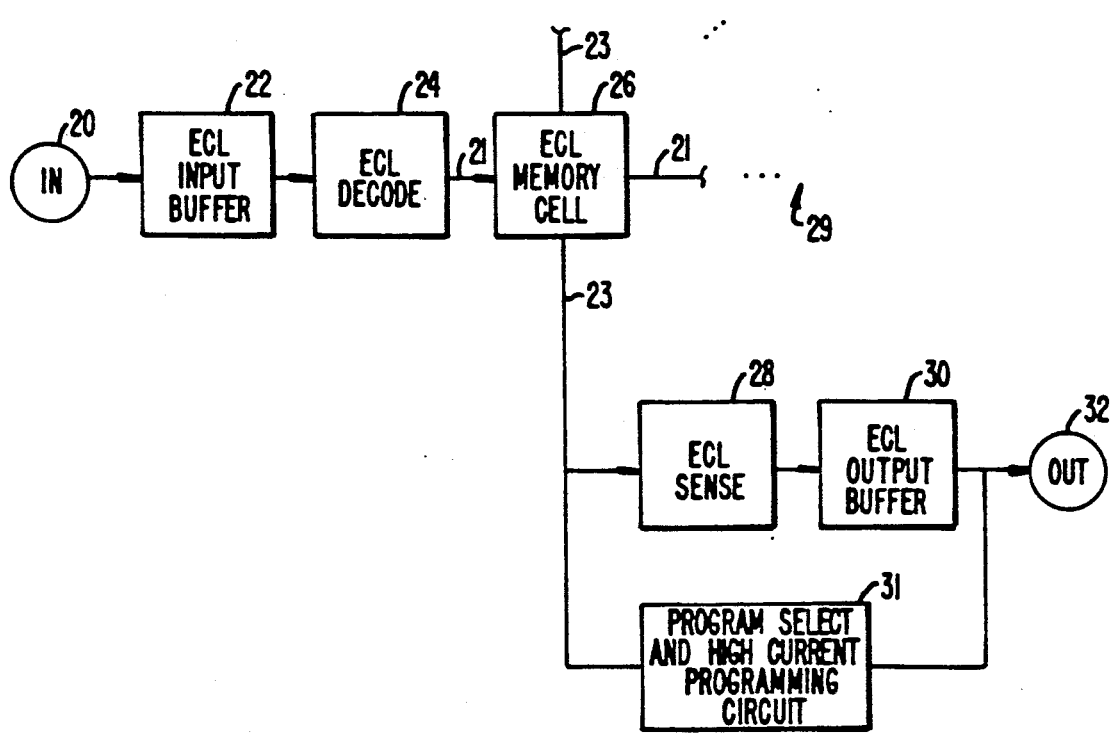
FIG._3A.
PRIOR ART

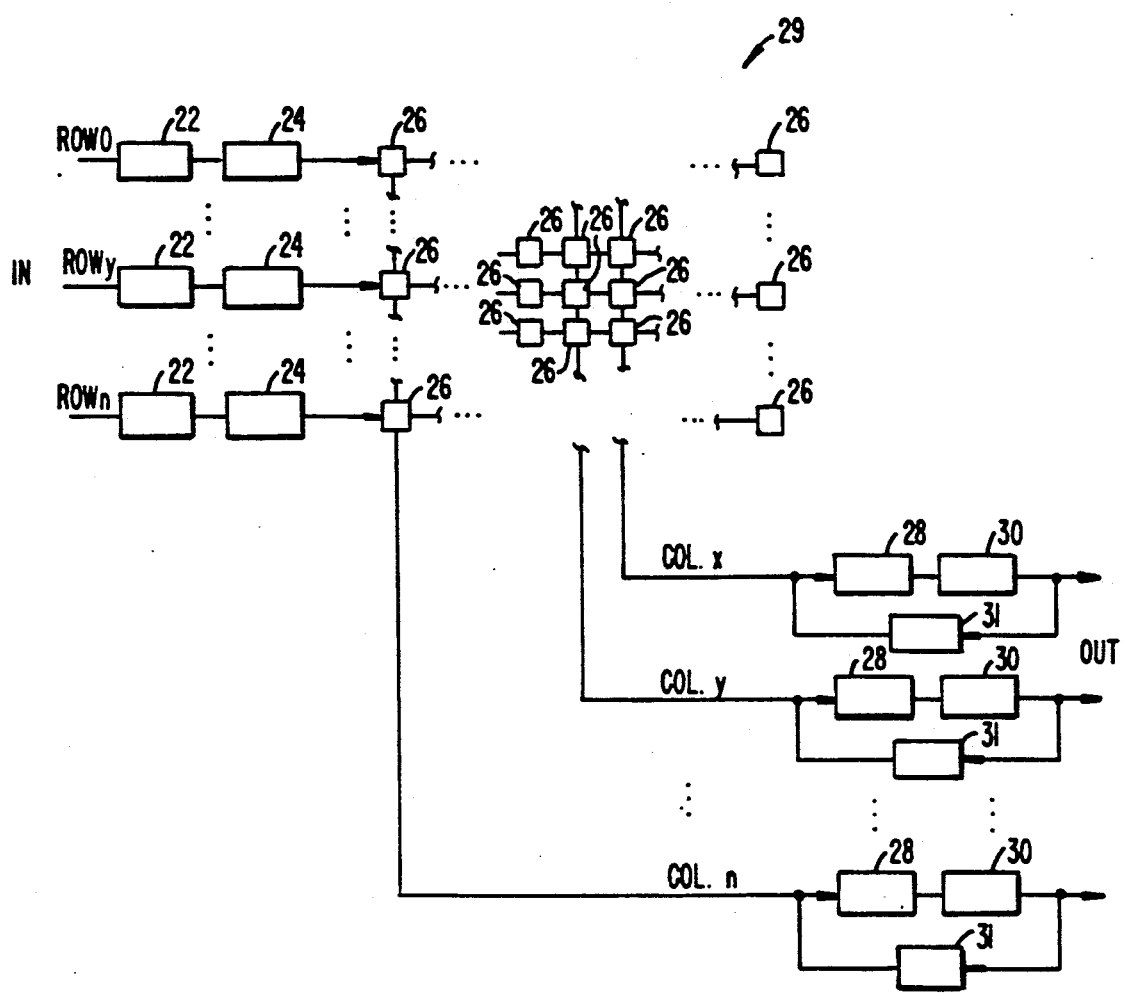
FIG._3B. PRIOR ART

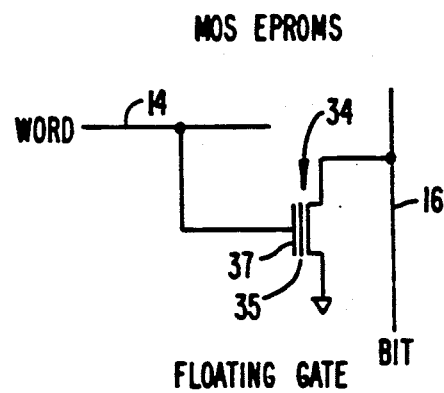
FIG._4. PRIOR ART
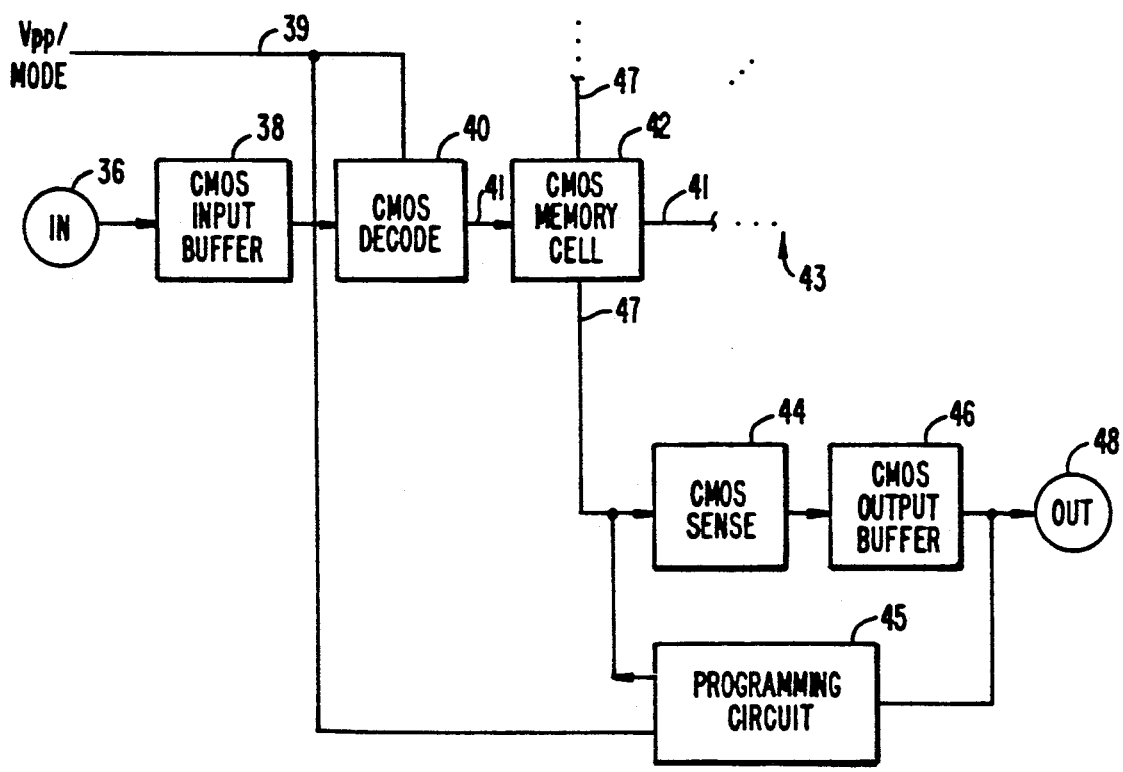
FIG._5. PRIOR ART

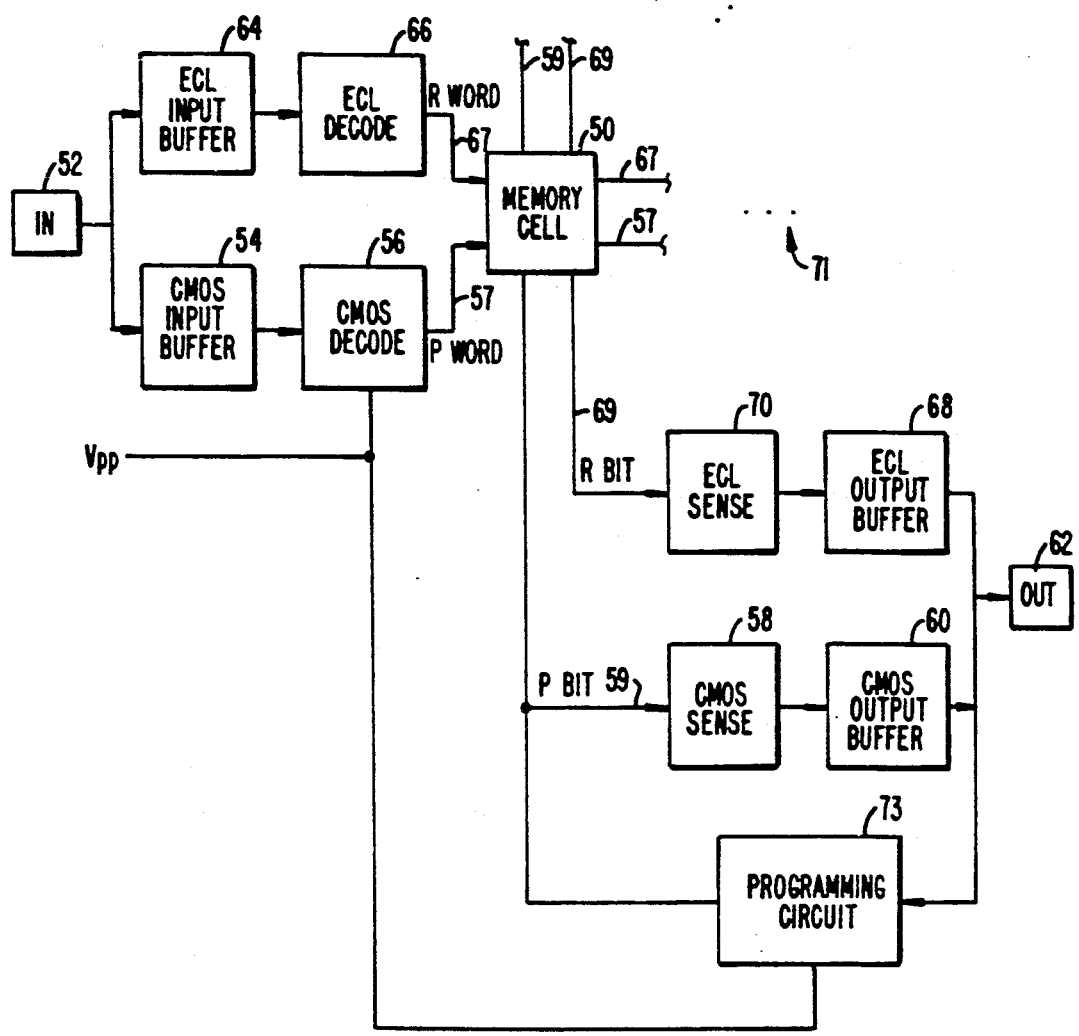
FIG._6.

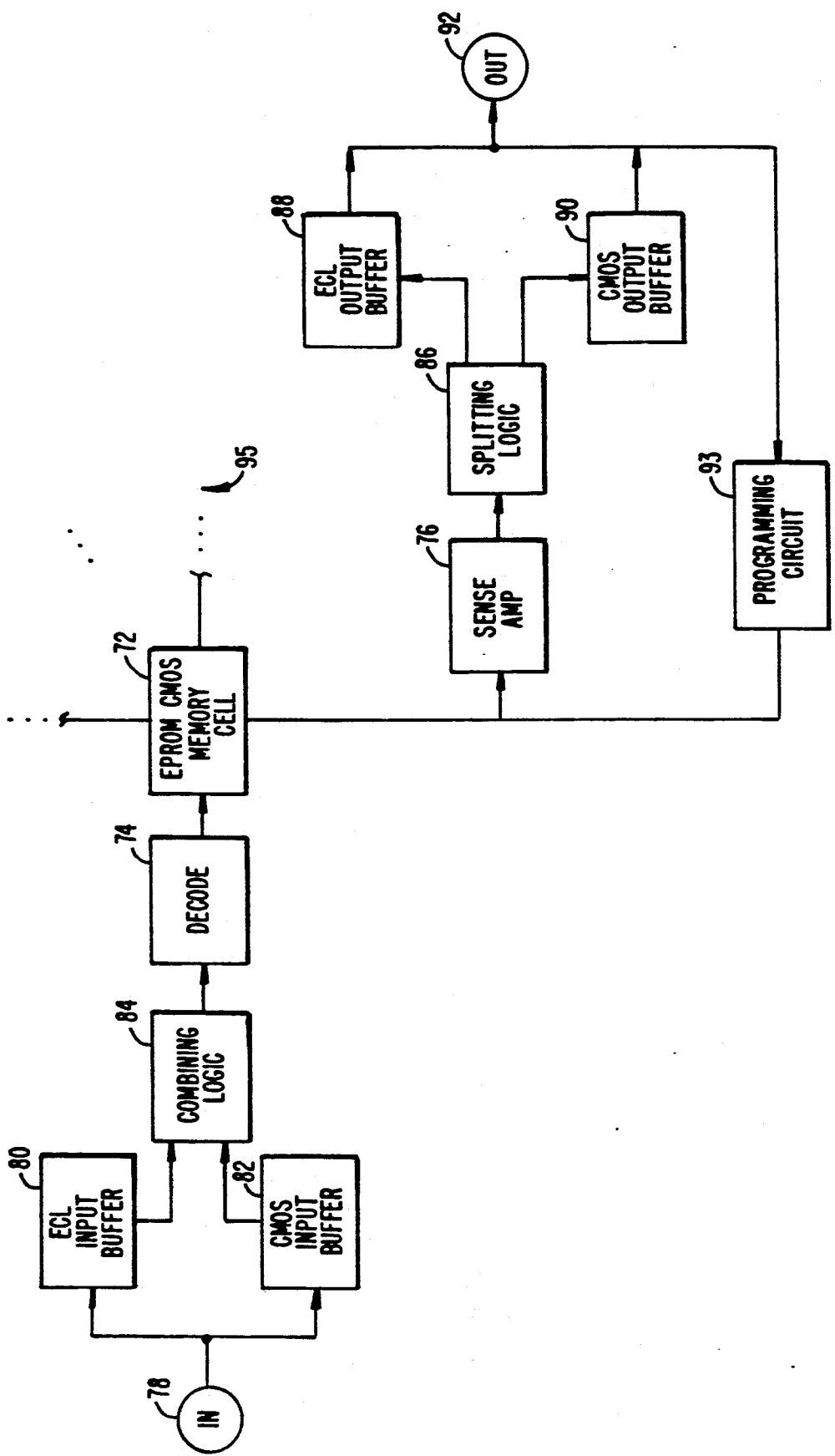
FIG._7.

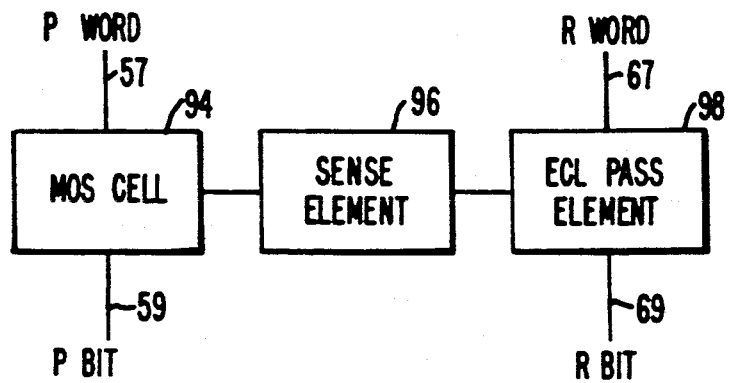
FIG._8.
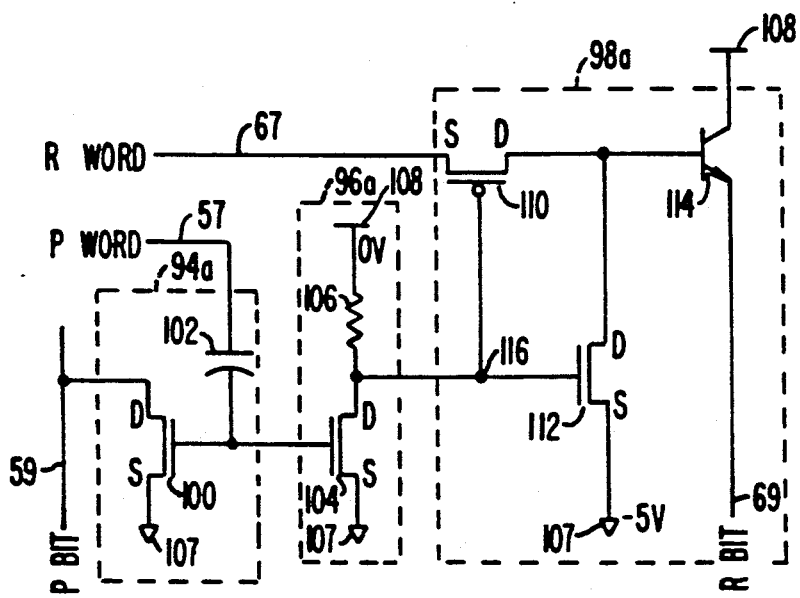
FIG._9.

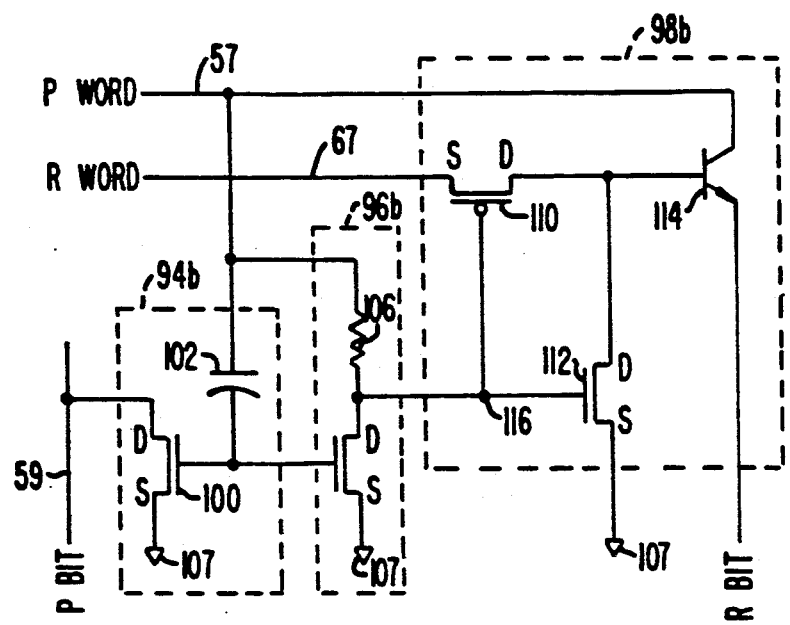
FIG._10.
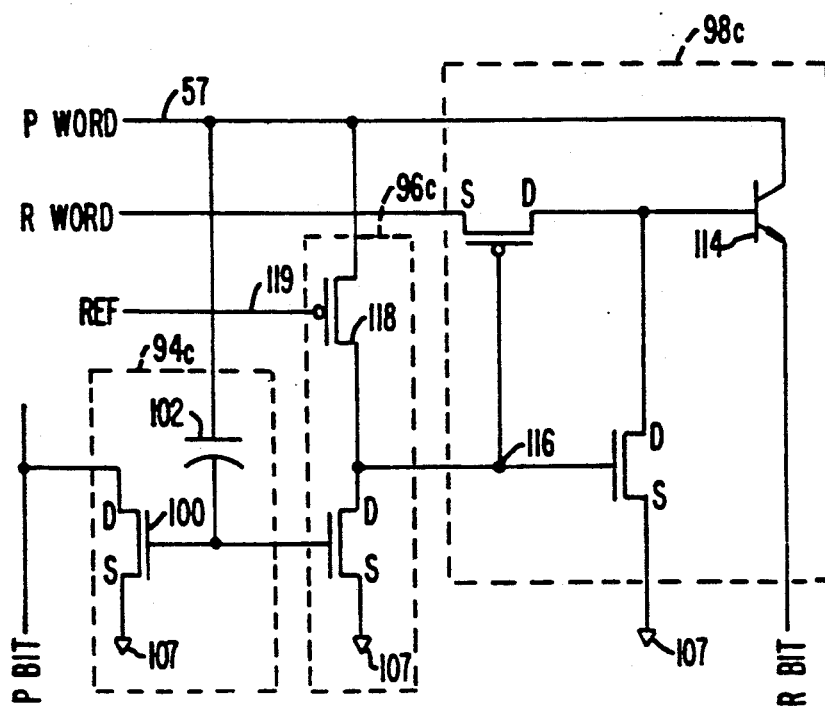
FIG._11.

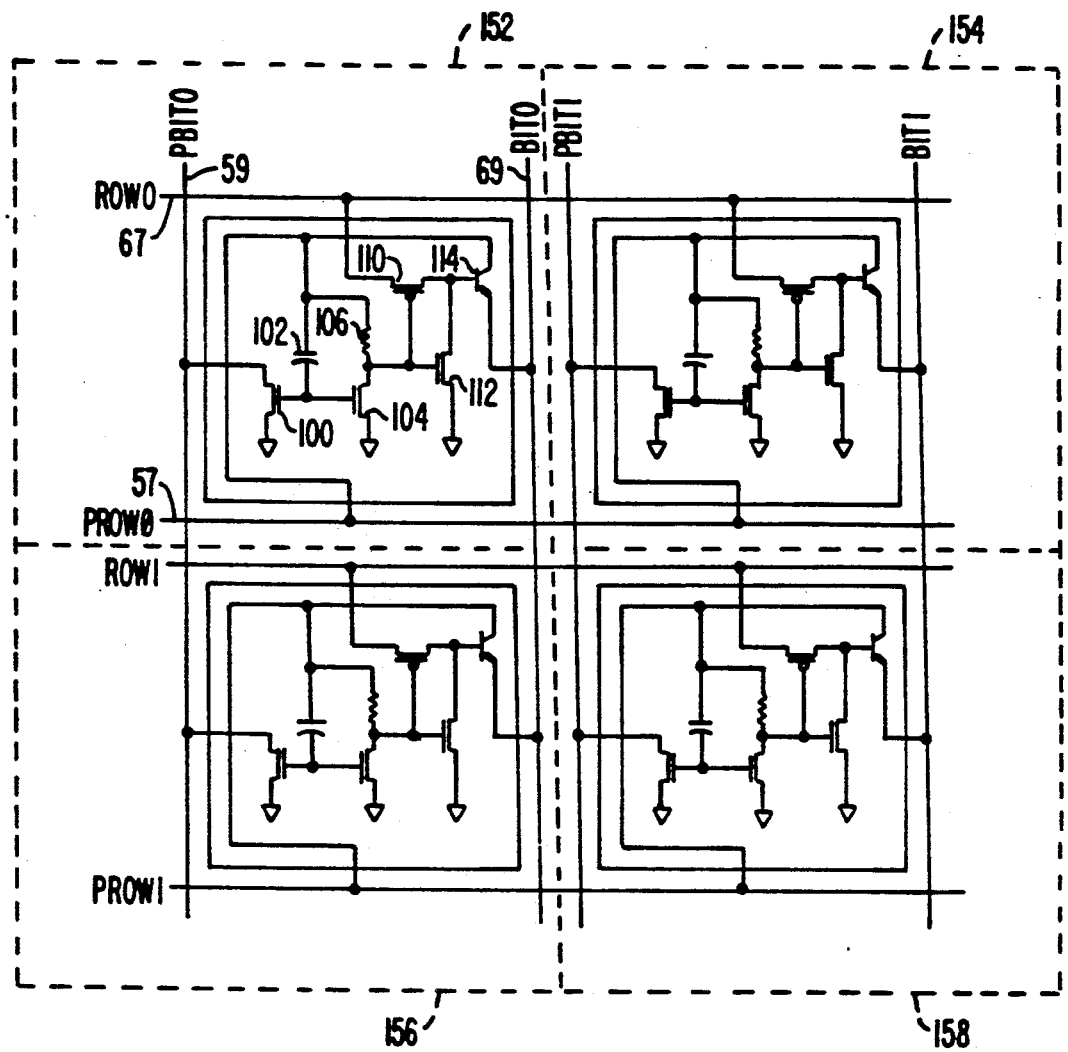
FIG._12.

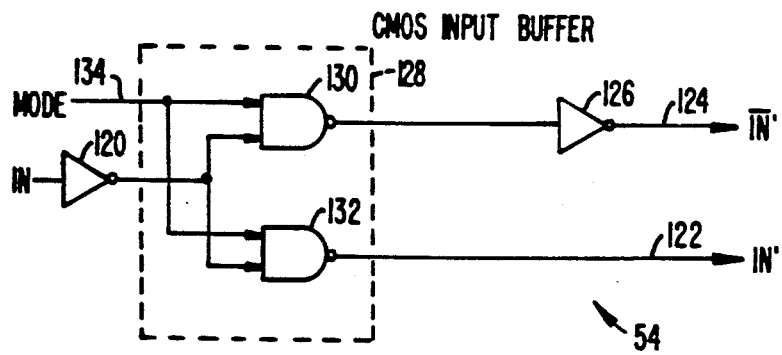
FIG._13.
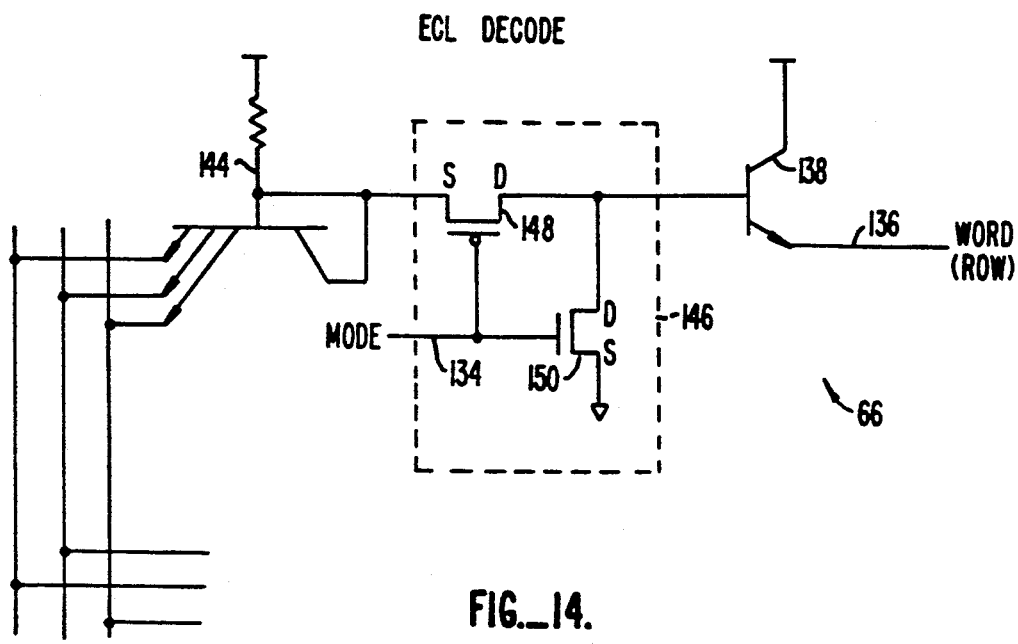
FIG._14.
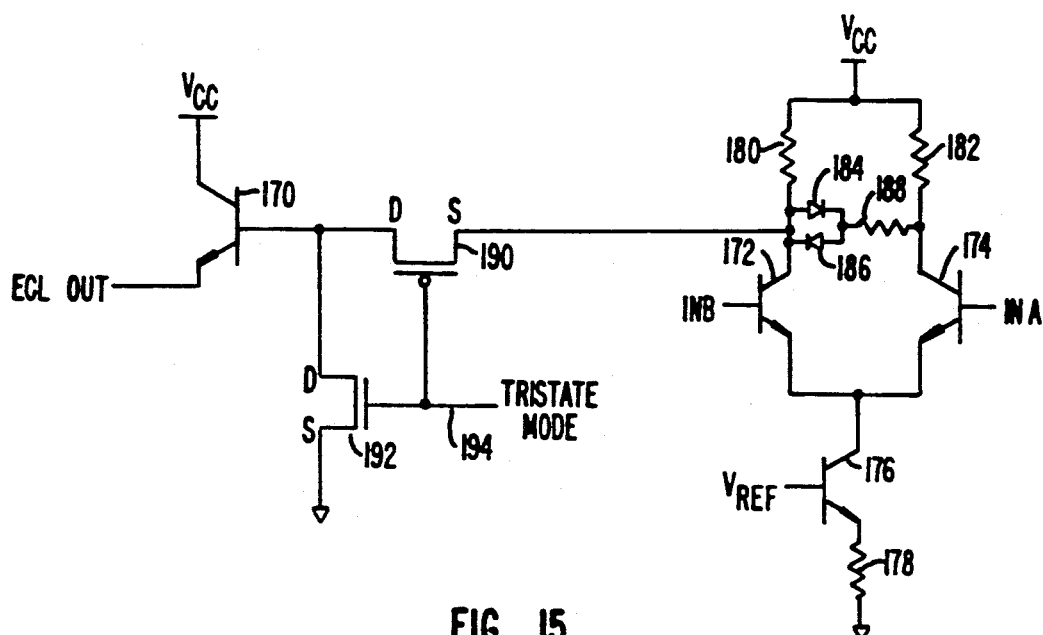
FIG._15.

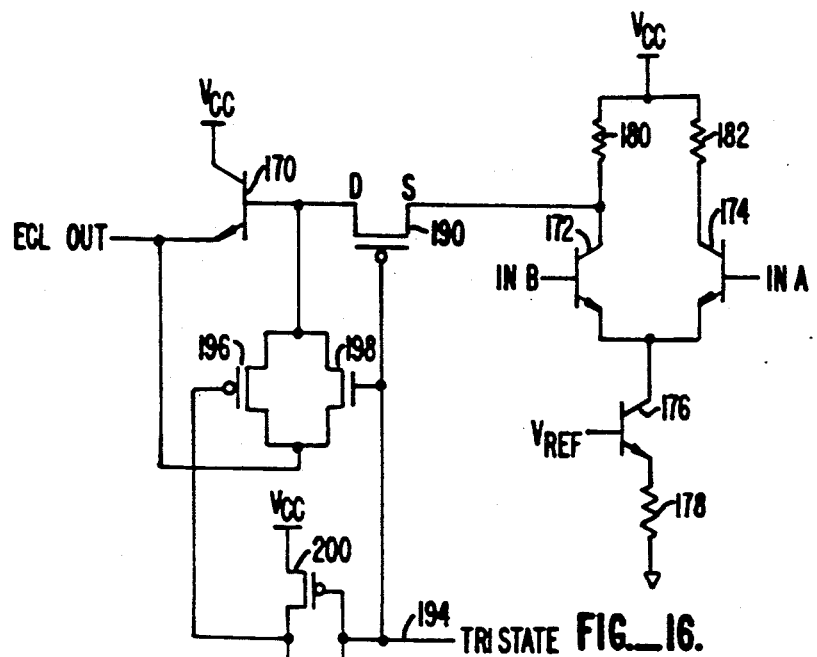
FIG._16.
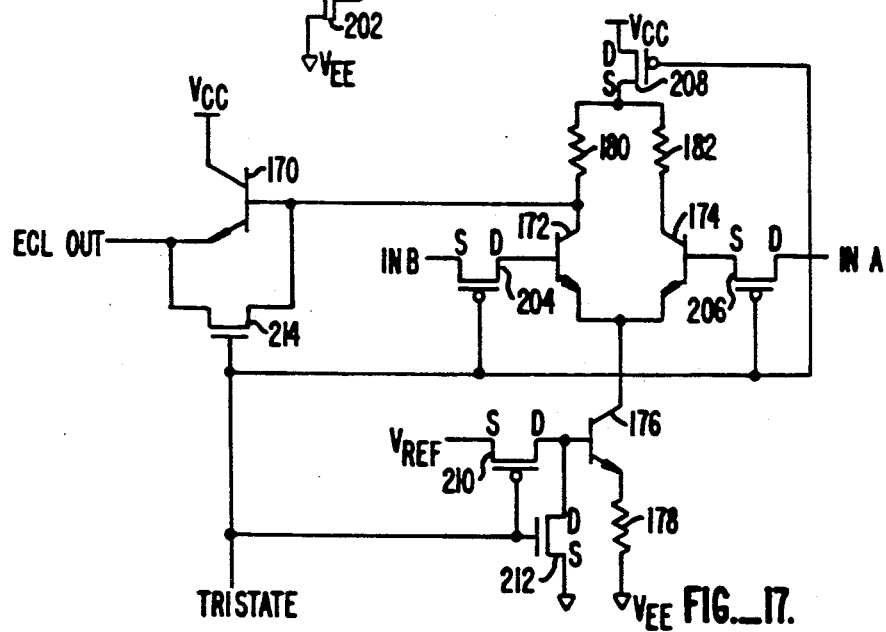
FIG._17.
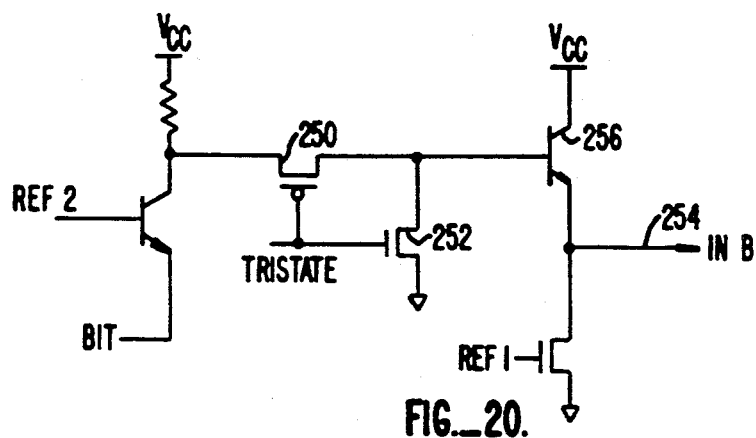
FIG._20.

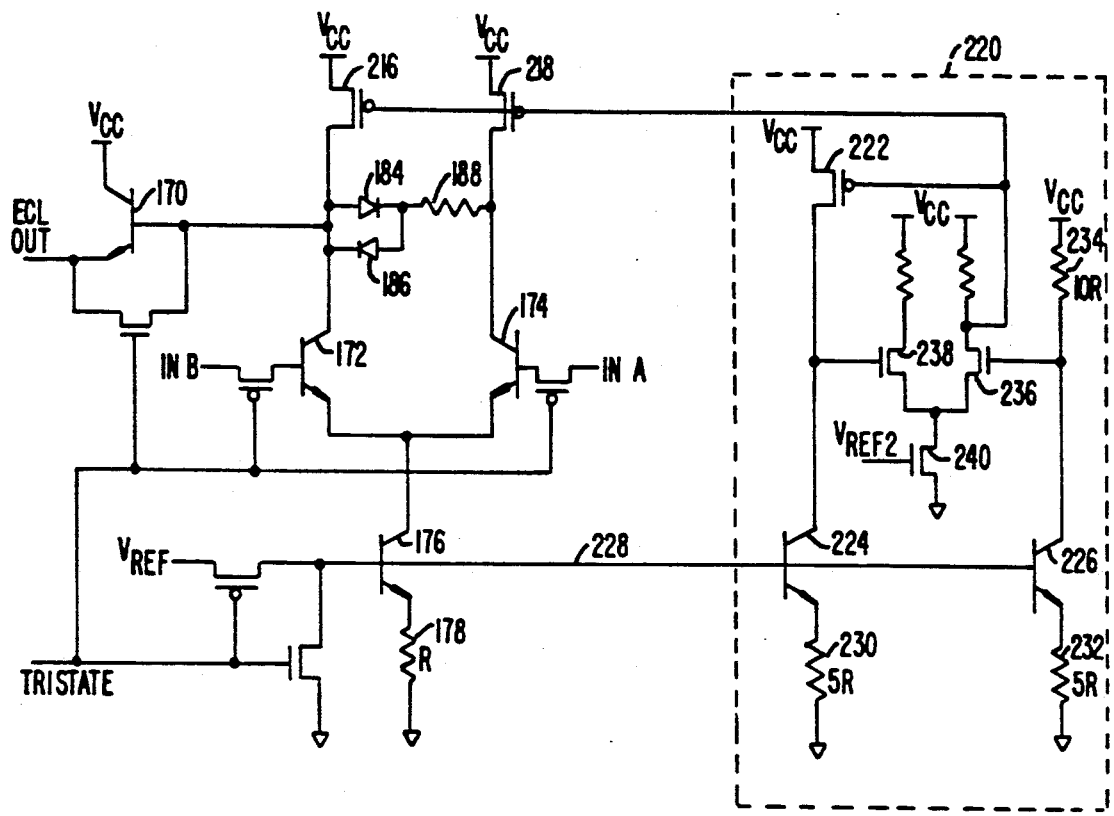
FIG.—18.
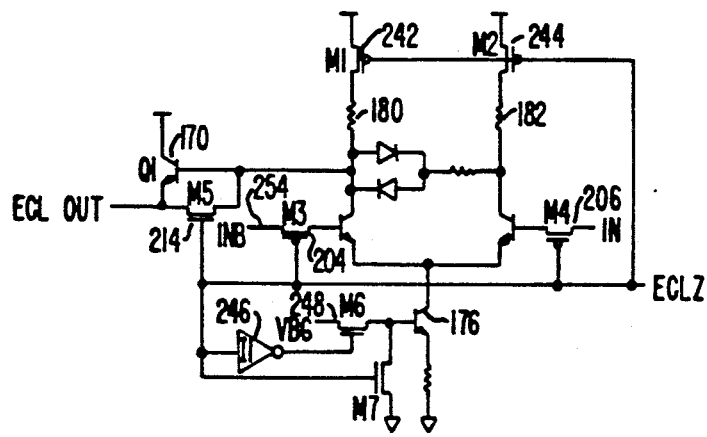
FIG.—19.

ECL EPROM WITH CMOS PROGRAMMING

BACKGROUND OF THE INVENTION

The present invention relates to electrically programmable read only memories (EPROM), and in particular to EPROMs employing both bipolar and complementary field effect transistors (BiCMOS).

Two popular circuit families are the transistor-to-transistor logic (TTL) and emitter coupled logic (ECL). CMOS circuits operate with TTL voltage levels, with high and low voltage levels of five and zero volts, respectively. Typically, a low level is defined as below 0.4 volts and a high level as above 2.4 volts, with a 5 volt voltage supply being used. This provides for a large voltage swing and thus large immunity to noise, but at the expense of slower speed due to the large transition needed. ECL circuits, on the other hand, are implemented with bipolar transistors, and operate with a voltage swing of approximately 0.8 volts, or the $V_{BE}$ of the bipolar transistor. Usually, a negative supply is used, with −4.5 or −5.2 volts being typical. Such circuits typically are used to drive a matched impedance output with a 50 ohm value. The 50 ohm value requires a large driving current and the matched impedance output eliminates reflections which may cause noise problems in a system having low noise margin.

Programmable read only memories (PROMs) have been developed using each technology. PROMs differ from Random Access Memories (RAMs) in their operation and structure. RAMs have both data inputs, data outputs and address inputs for selecting the data locations. PROMs have only address inputs and data outputs because they are only read after programming. The data outputs function as data inputs during programming.

Examples of two bipolar PROM cells, each of which can be programmed only once, are shown in FIGS. 1 and 2. Bipolar erasable PROMs (EPROMs) have not been developed. FIG. 1 shows a metal fuse configuration in which a fuse 10 is coupled in series with a diode 12 between a word line 14 and a bit line 16. By providing a large current pulse to a fuse, the fuse is melted away, or blown, thus programming the connection. The open connection can be interpreted by suitable addressing and reading circuitry as a zero or one, with the closed connection interpreted complementarily.

A transistor fuse is shown in FIG. 2. There, a bipolar transistor 18 is coupled between word line 14 and bit line 16. A reverse current through the transistor programs it by shorting the emitter-base junction, causing the transistor to behave functionally as a diode. Importantly, the memory cells of both FIG. 1 and FIG. 2 can be programmed once only and cannot have the programming reversed. These memory cells have the advantage, however, being operable with ECL voltage levels, using a 0.8 volt swing.

Typically, test rows and test columns of memory cells are included for testing the speed of a bipolar PROM chip prior to shipment to a customer. The rest of the memory cell array will not be programmed until the customer receives the chip, and thus cannot be tested prior to customer shipment. Because the main part of the array cannot be programmed and tested prior to customer shipment, it cannot be determined whether it will perform at the same speed as the test rows and columns. Accordingly, a margin of error is built in so that the test rows and columns must be faster than the speed in the product specification by a certain amount. This allows a "guard band" in case some of the actual array rows and columns are slower. Because the entire array cannot be programmed and tested prior to shipment, there are a larger number of failures after programming in the field than for CMOS EPROMs, which can be fully tested before shipment.

Because fuses are used for ECL PROMs, a high current pulse is necessary to blow the fuse. This requires a large current driver which may be the same driver as is used for sensing, or may be a separate driver coupled to the same line. In either case, the large driver adds to the capacitance of the line, thus slowing performance. In addition, wider metal lines are required to handle the large current pulses. Since the cells are read using the same metal lines, the lines are larger than they need to be for the read operation. Typical ECL PROMs have an access time of 10–25 nanoseconds (ns).

FIG. 3A is a block diagram of one embodiment of a complete memory circuit for one row (word line) 21 and one column (bit line) 23 of an array 29 using the cell of FIGS. 1 or 2. For programming, a bit to be programmed has its output pin 32 selected. This causes a high current pulse to be sent through program select and programming circuit 31 on column line 23. Any cell selected by not having a high value applied to its word line (i.e., word line 21) will have its fuse blown and be programmed. Only the bits to be programmed have a voltage applied to their output pin 32. After programming, during a read operation, an input pin 20 receives an address signal and provides it through an ECL input buffer 22 to an ECL decode circuit 24 to select the proper memory cell from thousands of other memory cells on the same integrated circuit. Output signals are provided through an ECL sense circuit 28 to an ECL output buffer 30 and an output pin 32. Of course, the ECL decode and ECL sense circuits actually are coupled to multiple memory cells, with only one being shown for simplicity.

FIG. 3B shows several of the circuits of FIG. 3A and a portion of an array 29. As can be seen, each row line has input buffer 22 and an ECL decode circuit 24. Each bit line (column) has an ECL sense circuit 28, an ECL output buffer 30 and a program select and high current programming circuit 31. Array 29 contains thousands of memory cells 26, with only a few shown for simplicity.

As can be seen, during programming, not only must the proper word line be selected by decoding the address input, but the bit line corresponding to the bit to be programmed must be selected by providing inputs on the data output pins. Thereafter, during a read operation, only the input words need be decoded, with each providing a multiple bit output byte on the plurality of bit lines. It will be appreciated that the decoding circuit has been somewhat simplified for explanation. Although a separate input buffer is provided for each address bit, the outputs of these input buffers are coupled into a single decode circuit which selects one of a large number of output word lines in response to a limited number of address bit inputs. Similar decoding, using components which can handle high currents, must be provided in high current programming circuit 27. Subsequent figures also use a simplified block for the decode circuit.

In contrast to bipolar technology, erasable PROMs (EPROMs) have been developed using MOS technology. An MOS EPROM cell is shown in FIG. 4 with word line 14 coupled to bit line 16 by a MOS transistor 34. Transistor 34 includes a floating gate 35, electrically isolated from the control gate 37. The transistor is programmed by electrons flowing onto the floating gate and being trapped there. This causes the floating gate to act as a capacitor holding charge, thereby altering the functionality of the transistor in a detectable manner, e.g. changing its threshold voltage. In one type cell, the programming is done by bringing both the word and bit lines high.

The MOS memory cell of FIG. 4 operates at TTL voltage levels, but has the advantage of being erasable. It can be erased, for example, by removing the charge from the floating gate using ultraviolet light or electrical techniques. Thus, a circuit can be programmed and verified, then erased and reprogrammed if necessary. The capability of reprogramming eliminates the need for test cells as in bipolar PROM circuits. One advantage of the memory cell of FIG. 4 is that it can be programmed using the standard 12.5 volt CMOS programming level (and later read with standard 0-5 volt I/O levels) while the bipolar PROM cells shown in FIGS. 1 and 2 typically require large current pulses for programming.

A typical MOS EPROM circuit is shown in FIG. 5. As shown, the circuit uses an array 43 of the cells of FIG. 4 with an input pin 36, input buffer 38 and decode circuit 40 for each word line 41. Each memory cell 42 is also connected to a bit line 47, which is coupled to a sense circuit 44, output buffer 46 and output pin 48. To program a memory cell 42 of FIG. 5, a 12.5 volt signal is provided on a Vpp pin 39 to address decode circuit 40 to the selected word line 41. Vpp pin 39 not only supplies the high voltage needed for programming, but also selects the programming mode when asserted by enabling programming circuit 45.

Any cell connected to a high word line and a bit line which is at a high value, such as bit line 47, will be programmed. An input provided through output pin 48 and programming circuit 45 causes bit line 47 to be a high value. Thus, this circuit requires a programming circuit coupled to the output pin, just as the bipolar PROM requires a programming circuit. However, the separate high current data input circuitry coupled to the output (or combined circuitry with high current capability) is eliminated. During a read operation, 5 volt levels are used to select the word line through input buffer 38 and decode circuit 40 with the bit lines being sensed through sense circuit 44 and output buffer 46.

Unfortunately, a typical access time for a CMOS EPROM is about 100-200 ns. Thus, there is a significant tradeoff between ECL and CMOS for programmable memories. The CMOS EPROMs give reprogrammability to the customer and the ability to program and test prior to customer shipment, but at the expense of a significantly greater access time. ECL PROMs, on the other hand, are faster, but cannot be fully tested prior to shipment and cannot be reprogrammed.

SUMMARY OF THE INVENTION

The present invention provides an ECL EPROM circuit which uses a MOS memory cell. The invention includes a technique for programming the memory cell using MOS voltage levels, and also includes circuitry for reading the memory cell at ECL voltage levels. Thus, the programming and reading paths are split to give the ease of programming and the reprogrammability of MOS EPROM devices combined with the reading speed of PROM devices using ECL voltage levels.

In one embodiment, two parallel paths are provided to a memory cell to enable it to separately receive reading and writing (programming) signals. The reading path employs ECL components for reading the cell, while the writing path contains MOS components for programming and verifying the cell. The memory cell itself contains a MOS memory element, an ECL pass element, and a sense element coupling the MOS memory element to the ECL pass element. The MOS memory element is coupled to the programming (writing) path, and the ECL pass element is coupled to the read path with a bipolar output transistor.

In operation, programming is done through the programming path to set the state of the MOS memory element. During a read operation, the read path, if selected, provides the sensed value of the MOS memory element to the output with the memory cell bipolar output transistor. The sense element provides an output corresponding to the programmed value of the MOS memory element. The output of the sense element is provided to the ECL pass element which activates or deactivates the memory cell bipolar output transistor. The bipolar output transistor provides an ECL 0.8 volt output swing.

The activation or deactivation of the memory cell output transistor eliminates any need to generate MOS voltage levels and translate them into ECL voltage levels. Because the memory cell output bipolar transistor is coupled between the ECL bit and word lines, it acts as the memory element for the ECL mode. The state of the memory cell bipolar transistor depends on whether it is activated or deactivated by the sense element.

In this embodiment, an ECL decoding circuit connected to sense the condition of the bipolar output transistor is disabled during the MOS programming. The MOS input buffer is disabled during read operations, to prevent read signals from reaching the programming path, and vice-versa.

To allow the ECL read path to connect to the MOS output path in the first embodiment without causing interference, a novel tri-state ECL output buffer is provided. Prior art ECL output buffers do not inherently produce a tri-state condition. The output buffer of a present invention uses a bipolar transistor with a circuit for disabling the current to the base of the output transistor in response to a tri-state mode signal.

Preferably, the output buffer includes a differential pair of bipolar transistors which drive the output bipolar transistor. The disabling means consists of a number of MOS transistors which isolate the power supply and the current source from the differential pair, and also disable the base drives to the differential pair. In addition, the emitter and base of the output bipolar transistor are coupled together in the tri-state mode to prevent emitter-base breakdown of the output transistor.

This embodiment of the present invention has been tested and found to have access times of 4-5 ns. This is faster than the prior art 10-25 ns access time of ECL PROMs. It is significantly faster than the prior art CMOS access times of 100-200 ns. The present invention also enables testing of all cells before customer shipment, thus producing fewer failures in the field than for prior art ECL PROMs.

An alternate embodiment uses a standard MOS memory cell, and combines the ECL read path and the MOS programming and verify path before the paths reach the memory cell. This is done using combination and splitting logic on either end, which, in effect, translates the ECL levels to MOS levels on the input, and translates MOS levels to ECL levels on the output. Because of the need for the translating circuitry in the speed path during the read mode, this second embodiment has a slower performance than the first embodiment during the read mode, but still is significantly faster compared to a standard CMOS EPROM cell. However, because a standard MOS memory cell is used, the memory cells are smaller, thus allowing more memory cells to be packed into a given area of silicon. Thus, there is a tradeoff of density versus speed between the two embodiments.

The present invention thus improves over the prior art by giving the speed of ECL PROMs with the reprogrammability and ability to test and verify at MOS levels of CMOS EPROMs. Using MOS voltage levels for programming permits standard MOS programming software and hardware to be used. Since the speed of circuit operation can be verified after programming, there is no need for the test rows or test columns of prior art ECL PROMs. Because high current pulses are not needed for programming, there is no need for the large current drivers and the associated capacitance of prior art ECL PROMs. This enables an even faster speed for the present invention than the fast prior art ECL PROMs. An additional speed improvement over the prior art ECL PROMs is obtained because the necessity for a guard band is eliminated. Since all of the rows and columns can be tested, there is no need to include a guard band to take into account a difference between untested and tested rows and columns.

The present invention therefore provides an ECL EPROM by combining the speed of ECL PROMs with the programming and verification capabilities of CMOS EPROMs.

For a further understanding of the invention, reference should be made to the ensuing detailed description in conjunction with the accompanying drawings.

BRIEF OF THE DRAWINGS

FIG. 1 a diagram of a prior art metal fuse PROM cell;

FIG. 2 is a diagram of a prior art bipolar transistor fuse PROM cell;

FIG. 3A is a block diagram of a prior art ECL PROM circuit;

FIG. 3B shows the circuit of FIG. 3A in an array;

FIG. 4 is a diagram of a prior art MOS EPROM cell;

FIG. 5 is a block diagram of a prior art MOS EPROM circuit;

FIG. 6 is a block diagram of one embodiment of an EPROM according to the present invention using a unique dual-input memory cell;

FIG. 7 is a block diagram of an alternate embodiment of an EPROM according to the present invention using a standard MOS memory cell;

FIG. 8 is a block diagram of a dual-input memory cell as used in the embodiment of FIG. 6;

FIG. 9 is a circuit diagram of a first embodiment of the memory cell of FIG. 8;

FIG. 10 is a circuit diagram of a second embodiment of the memory cell of FIG. 8;

FIG. 11 is a circuit diagram of a third embodiment of the memory cell of FIG. 8;

FIG. 12 is a diagram of a portion of an array using the memory cell of FIG. 10;

FIG. 13 is a block diagram of the MOS input buffer of FIG. 6;

FIG. 14 is a circuit diagram of a portion of the ECL decode circuit of FIG. 6;

FIG. 15 is a circuit diagram of a first embodiment of a tri-state ECL output buffer with a PMOS transistor between the differential pair and the output transistor;

FIG. 16 is a second embodiment of the circuit of FIG. 15 adding a base-emitter bypass for the output transistor;

FIG. 17 is a third embodiment of an ECL tri-state output buffer without a PMOS transistor at the base of the output transistor;

FIG. 18 is a fourth embodiment of tri-state ECL output buffer with separate power supply isolation transistors for the differential pair;

FIG. 19 is a fifth embodiment of a tri-state ECL output buffer using an inverter in the differential pair current source isolation circuit; and FIG. 20 is a circuit diagram of a portion of a sense amplifier showing the preferred position of the isolation transistors in the base path of the differential transistors of FIG. 19.

DETAILED DESCRIPTION OF THE PREFERRED EMBODIMENTS

FIG. 6 is a block diagram of a first embodiment of an ECL EPROM according to the present invention using separate programming and read paths and a unique, dual input memory cell 50. Although only a single memory cell is shown for simplicity, each word line is connected to a row of memory cells and each bit line is connected to a column of memory cells in an array. In addition, a memory chip will have a number of row and column lines, each with its own input and output circuitry.

The programming and verify side of the circuit consists of an input buffer 54, a decode circuit 56, a sense circuit 58, an output buffer 60 and a programming circuit 73. The reading, or ECL, side of the circuit consists of an ECL input buffer 64, an ECL decode circuit 66, an ECL sense circuit 70 and an ECL output buffer 68.

During programming, the Vpp signal provides the 12.5 volt level and enables programming circuit 73. The programming word (or row) input signal is provided through input pin 52 to input buffer 54, and then decode circuit 56, then via programming word line 57 to memory cell 50. Preferably buffer 54 and decode circuit 56 are fabricated using CMOS technology. The programming data is provided a byte at a time with each bit being provided through an output pin 62 to programming circuit 73, then via bit (or column) line 59 to memory cell 50.

After programming, the contents of each memory cell can be verified (read) using the programming word and bit lines. The address is decoded to provide an input to the appropriate word line. A memory cell is thus selected by a signal provided through input pin 52, input buffer 54, decode circuit 56 and word line 57 to memory cell 50. The output signal from memory cell 50 is provided through bit line 59 to MOS sense circuit 58, then to output buffer 60 and output pin 62. The other bit lines are similarly sensed with appropriate circuitry, just as other word lines are appropriately selected. The sense circuit and output buffer also are preferably fabricated using CMOS technology. During programming and verification, the ECL side of the circuit is disabled with either the ECL input buffer 64 or ECL decode circuit 66 being disabled, as will be discussed later.

After programming and verification, the circuit can be operated in a normal read mode using the ECL side. The address inputs are decoded using input buffer 64 and decode circuit 66 to select an appropriate word line, such as word line 67. An ECL sense circuit 70 provides the output signal from a read bit line 69 to ECL output buffer 68. ECL output buffer 68 is a unique tri-state ECL output buffer (FIGS. 15-19) which will be in the tri-state condition, and thus effectively disabled, during programming. This ECL path is used only for reading, and is not usable for programming. No ECL PROM programming capability is provided, thus eliminating the need for the high current input of FIG. 3A and the need for an additional program select circuit for the ECL read bit line 69.

Of course, each of the word and bit lines are provided to multiple memory cells, only one of which is shown in FIG. 6 for simplicity. FIG. 12 illustrates the bit and word line connections for 4 memory cells.

After programming, the correctness of the state of the memory cell 50 can be verified by a read using the MOS path. Thereafter, during normal circuit operation, the circuit can be read using the much faster ECL path. During an ECL read cycle the read input signal is provided through input buffer 64, decode circuit 66 and read word line 67 to memory cell 50. The output of memory cell 50 is detected from read bit line 69 by ECL sense circuit 70 and supplied to output buffer 68. Just as the ECL input and output must be disabled during MOS programming and verification, the MOS input and output circuitry must be disabled during the ECL read mode. One of MOS input buffer 54 or decode circuit 56 must be disabled. Preferably MOS output buffer 60 is a tri-state buffer in the tri-state condition. Circuitry for disabling the MOS circuitry is discussed below. Program circuit 73 is disabled during the ECL read with isolating CMOS transistors, similar to the disabling of the input buffer.

The circuit of FIG. 6 thus allows programming at the standard 12.5 volt MOS programming level and reading at the standard ECL −0.9 to −1.7 volt read levels thereby providing the speed advantages of a read operation at the smaller swing ECL voltage levels. In addition, the re-programmability of MOS EPROMs is provided. Thus, an ECL-performance memory product is provided which can be easily programmed using the standard MOS programmers which are readily available in the marketplace.

FIG. 7 shows an alternate embodiment of the present invention in which a standard MOS memory cell 72 is used, such as cell 42 of FIG. 5, in an array 95. Similarly, decode circuit 74 and sense amp 76 correspond to blocks 40 and 44, respectively of FIG. 5. However, an input signal is provided through input pin 78 along two paths, through ECL input buffer 80 and MOS input buffer 82 to combinational logic 84 which selects one of the inputs depending upon the mode of operation. On the function, providing the output signals to either ECL output buffer 88 or MOS output buffer 90, (depending on whether it is a programming or reading operation) and then to an output pin 92. Here, the combining and splitting function is done separately from the memory cell, rather than in the memory cell as in FIG. 6. A programming circuit 93 is provided as well.

Returning to the first embodiment, FIG. 8 shows the unique, dual-input memory cell of FIG. 6 in block diagram form. A MOS memory cell 94 is coupled between programming word input line 57 and programming bit output line 59. This MOS cell is programmed using 12.5 volt levels and then verified in the normal MOS manner. During read, the output of MOS cell 94 is provided through a sense element 96 to an ECL pass element 98. Pass element 98 is connected between the read word line 67 and the read bit line 69.

FIG. 9 shows one embodiment of the memory cell of FIG. 8. In the circuit of FIG. 9, the emitter of bipolar transistor 114 is connected to a read bit line (or column decode) 69, which is also common to other memory cells. The base of transistor 114 is connected through a PMOS device 110 to a read word (row) line 67, which is also common to other memory cells. Programming bit line 59, which is also common to other memory cells, is connected to an NMOS transistor 100. Programming word line 57, also common to other memory cells, is connected through a capacitor 102 to the gates of transistors 100 and 104. Transistor 100 and capacitor 102 form a MOS cell 94a. The sense element is element 96a which includes the NMOS transistor 104 and a resistor 106 coupled to a positive voltage supply 108. Sense element 96a senses the state of MOS cell 94a. Finally, an ECL pass element 98a is coupled between read word line 67 and read bit line 69. Element 98a includes PMOS transistor 110 and an NMOS transistor 112, as well as a bipolar transistor 114 coupled to positive voltage source 108. The gates of transistors 110 and 112 are both controlled by sense element 96a.

The source of PMOS transistor 110 is shown connected to read word line 67. Alternatively, the drain of PMOS transistor 110 could be connected to read word line 67. Positive voltage supply 108 is preferably 5.0 volts during programming, word line 57 is at 12.5 volts from the 12.5 volt Vpp, and negative supply 107 is 0 volts. During verify, supply 108 is +5 volts. During ECL read, positive supply 108 is 0 volts and negative supply 107 is −4.5 or −5.2 volts.

To program the cells, input and output signals are provided through the lower, CMOS path of FIG. 6, with the upper ECL path being disabled by a mode signal. Cell 94a is programmed by charging capacitor 102. If programming bit line 59 is selected to be high, current will flow through transistor 100 if word line 57 is also high, thus charging capacitor 102. One word line at a time is brought high for programming. If bit line 59 is not selected, transistor 100 is shut off and there will be no place for the current from word line 57 to flow. Thus capacitor 102 will not be charged. The only other path for current is through transistor 104. No significant current will flow into transistor 104 because of the large value of resistor 106, which is a gigaohm resistor. After programming, the memory contents are verified by doing a read through the CMOS path coupled to programming bit and word lines 59 and 57.

To perform an ECL read, positive supply 108 is set to 0 volts, negative supply 107 is set to −5 volts and all programming word lines 57 are set to 0 volts. The upper ECL path of FIG. 6 is used, with the lower CMOS path being disabled. If no charge is stored on capacitor 102, this will turn on transistor 104, bringing down the voltage at node 116. This will turn on transistor 110, providing a path to the base of bipolar transistor 114, to turn it on if there is a high voltage on word line 67. On the other hand, if there is charge stored on capacitor 102, node 116 will remain high. This will turn on transistor 112, which will pull down the base of transistor 114, ensuring that it stays turned off. By using a gigaohm resistor for resistor 106, little current is used, thus conserving power. Thus, a high value stored in a memory cell will cause the high value on the selected word line to be passed onto the bit line, giving the high level output. For a low value, the output transistor is turned off, giving a low value on the bit line regardless of whether the word line for that cell is selected.

FIG. 10 shows an alternate embodiment of the memory cell of FIG. 8, which is similar to FIG. 9 except that programming word line 57 is used as the voltage supply in the read mode, and is thus coupled to resistor 106 and transistor 114. In all other respects, the operation of the circuit of FIG. 10 is similar to that of FIG. 9. During the read mode, the programming word line 57 must be brought high so that it can be used as a voltage reference. The MOS cell, sense element and ECL pass element are indicated as 94b, 96b and 98b, respectively.

FIG. 11 shows another embodiment of the memory cell of FIG. 8. In this version, programming word line 57 is used for the voltage reference as in FIG. 10. In addition, a PMOS transistor 118 is used instead of resistor 106. The gate of transistor 118 is connected to a voltage reference 119 and acts as a current source. The operation is otherwise similar to that of FIGS. 9 and 10.

In a read operation, for the circuits of FIGS. 9, 10 and 11, base current will pass through PMOS device 110 to the base of transistor 114 when node 116 is at a low potential, and base current will not pass when node 116 is at a high potential. Therefore, we can see that the state of node 116 will determine the state of the memory cell in the high speed ECL read mode.

FIG. 12 is a circuit schematic of a portion of an array containing 4 memory cells using the memory cell of FIG. 10 to illustrate how such cells may be combined into an array. The 4 memory cells are indicated in phantom as cells 152, 154, 156 and 158. Cell 152 is labelled to show the components of FIG. 10. Cells 154, 156 and 158 have identical components. Cell 154 uses the same programming and read word (or row) lines 57 and 67 as cell 152, but different programming bit and read bit lines (PBIT1, BIT1). Cell 156 uses the same programming bit and read bit lines 5g and 6g of cell 152, but different programming word and read word, or row, lines (PROW1, ROW1).

FIG. 13 shows a preferred embodiment of MOS input buffer 54 of FIG. 6. As in a standard input buffer, the input signal IN is provided through an inverter 120 to provide a true input on a line 122 and a complementary input on a line 124 after passing through a second inverter 126 (NAND gates 130 and 132 would not be present). However, disabling circuitry 128 is included for purposes of the present invention. Circuit 128 contains a pair of NAND gates 130 and 132. These gates receive the input from inverter 120 and a mode signal on a line 134. The signal on mode line 134 acts to disable the input during the read mode, thereby preventing any programming inputs being provided to the memory cell while a read is being done through the parallel ECL input buffer.

ECL decode circuit 66 of FIG. 6 is shown in more detail in FIG. 14. A word or row line 136 is provided to the emitter of a transistor 138 in a standard manner. The base of transistor 138 is coupled to the base and collector of a transistor 144 which has multiple emitters coupled to the various decoding lines. For purposes of the present invention, a disabling circuit 146 is included with a PMOS transistor 148 and a NMOS transistor 150.

As can be seen, when a signal is provided on a mode line 134, a high level will disable transistor 148 and enable transistor 150, thus ensuring that the connection between transistors 138 and 144 is disabled.

The memory circuits of FIGS. 9, 10 and 11 are used in the circuit of FIG. 6, which requires an ECL output buffer with a tri-state capability. FIG. 15 shows a first embodiment of an ECL output buffer which has a tri-state, high impedance capability. Thus, when the tri-state mode signal is supplied, the output assumes a high impedance state. This way, it does not affect, and is not affected by, signals on the ECL output line to and from the parallel CMOS circuitry. The tri-state, high impedance capability isolates it from the MOS output buffer during programming and verify.

An output transistor 170 provides an ECL output at its emitter. A differential pair of transistors 172 and 174 receive the bit line outputs for the inverted and noninverted states, respectively, at their bases. A transistor 176 in conjunction with resistor 178 provides a current source. Resistors 180 and 182 couple the differential pair to the positive 0 volt power supply Vcc. The output is taken from the collector of transistor 172 and provided to the base of NPN emitter-follower output transistor 170. Diodes 184 and 186 and resistor 188 are provided for temperature compensation. Typically, Vcc will be zero volts and the ground indication at the end of resistor 178 will be negative 4.5 or 5.2 volts.

A PMOS transistor 190 and an NMOS transistor 192 put output transistor 170 in a tri-state mode in response to a tri-state mode signal on a line 194. This tri-state mode signal is the same signal which appears on line 134 in FIGS. 13 and 14 for disabling the CMOS input buffer and ECL decode circuit, respectively. PMOS transistor 190 serves to open the base connection while transistor 192 insures that the base is pulled down. The draw back of this embodiment is that PMOS transistor 190 is placed in the speed path of the operation of the circuit. Thus, during the normal ECL read, the capacitance of the PMOS transistor 190 slows the signal transitions. Another problem with this embodiment is the possibility of base-emitter breakdown of output transistor 170 when the emitter is driven high by the MOS output buffer which is coupled to it.

FIG. 16 shows an alternate embodiment which addresses the emitter-base breakdown problem by adding transistors 196 and 198 to couple the emitter and base of output transistor 170 together. In the tri-state mode, when the ECL buffer is in the high impedance mode and the ECL output is driven high, P channel device 196 allows the emitter to follow and go high as well. Similarly, when a low signal is coupled to the ECL output, NMOS device 198 allows the emitter to be pulled low as well. This combination prevents a high base emitter differential and thus prevents emitter-base breakdown. Transistors 200 and 202 form an inverter to invert the tri-state signal supplied to the gate of transistor 196.

FIG. 17 shows an alternate embodiment in which the PMOS transistor is removed from the speed path between differential pair 172, 174 and output transistor 170. Instead, the isolating devices are moved back into the base path of transistors 172 and 174. These isolating devices are shown as PMOS transistors 204 and 206. By isolating the signal further back, this creates the need to also isolate the emitters and collectors of the differential pair from the power supply and the current source, respectively. A PMOS transistor 208 is used to isolate the power supply. PMOS transistor 210 and NMOS transistor 212 are used to disable current source transistor 176. Finally, an NMOS transistor 214 is used to couple the ECL output to the base of output transistor 170. A single transistor 214 has been shown for simplicity. Preferably, the multiple transistor structure of FIG. 16 using transistors 196 and 198 along with the inverter composed of transistors 200 and 202 is used. Since transistors 204 and 206 are in the base path, rather than in the collector path, of emitter-coupled transistors 172 and 174, they can be smaller devices and thus their effect on the speed is less since they will have less capacitance.

FIG. 18 is yet another embodiment of the output buffer which is similar to FIG. 17 except that two separate PMOS transistors 216 and 218 are used to isolate the collectors of emitter-coupled transistors 172 and 174. These PMOS transistors 216 and 218 also replace load resistors 180 and 182 in the non-tri-state mode. A high gain NMOS amplifier 220 is used to control the gates of PMOS transistors 216 and 218 to cause them, in the active state, to act like resistors. A single amplifier circuit 220 could be used for all of the bit line outputs of the array. This single circuit will eliminate the need for separate load resistors in each output bit line. Transistors 216 and 218 and PMOS transistor 222 in amplifier 220 all operate in the linear region to make transistors 216 and 218 act like resistors. Amplifier 220 is isolated in the tri-state mode by disabling current source transistors 224 and 226 with the same line 228 that disables current source transistor 176.

Current source resistors 230 and 232 preferably have a value five times as large as current source resistor 178, and half the value of resistor 234, which is coupled to the collector of current source transistor resistor 178, and half the value of resistor 234, which is coupled to the collector of current source transistor 226. Resistors 234 and 232 form a voltage divider to set the voltage level at the gate of transistor 236. Transistor 236 forms a differential pair with transistor 238, with a common current source transistor 240.

The operation of transistors 216 and 218 such that they have the characteristics of resistors is as follows. As more current is drawn through transistor 236, the gate voltage of transistor 222 will decrease, causing the gate of transistor 238 to equal the gate voltage of transistor 236. Therefore the voltage/current characteristic of transistor 222 is actively regulated to match the characteristic of resistor 234. The identical regulating signal is also delivered to transistors 216 and 218, which then behave as resistors.

FIG. 18 also shows a temperature compensation circuit of diodes 184 and 186 and resistor 188. This temperature compensation circuit is also preferably included in the circuits of FIGS. 16 and 17, but was omitted for simplicity.

FIG. 19 shows another embodiment of the ECL tristate output buffer with separate PMOS transistors 242 and 244 for isolating the emitter coupled transistors from the power supply. This circuit is similar to that of FIG. 18 except that load resistors 180 and 182 are included, inverter 246 is added and an NMOS transistor 248 is employed instead of PMOS transistor 210. This gives better performance at lower voltage levels. The use of two isolation transistors 242 and 244 for the power supply, instead of the single transistor 208 of FIG. 17, allows smaller transistors to be used. Transistor 214, similar to transistor 215 of FIG. 17, is preferably replaced with the multiple transistors 196-202 of FIG. 16. These transistors prevent output transistor 170 from receiving excessive voltage across its emitter-any DC current in the ECL buffer. Transistors 242 and 244 allow the output buffer to be disconnected from the positive supply VCC without compromising the ECL high voltage levels. Transistors 204 and 206 disconnect the bases of emitter-coupled pair 172, 174, allowing them to go low.

Preferably, the disconnection of the base path by transistors 204 and 206 is done further back in the circuit, rather than directly at the bases of transistors 172 and 174. FIG. 20 shows such an isolating transistor 250 with an associated pull down transistor 252. Instead of being connected in line 254, as is transistor 204 in FIG. 19, they are connected to the base of a transistor 256 in the sense amplifier. Thus, even less current is switched, allowing an even smaller transistor 250 and correspondingly smaller capacitance. This results in less effect of the speed of the device in the normal ECL read mode.

As will be understood by those of skill in the art, the present invention can be embodied in many specific forms without departing from the spirit or essential characteristics thereof. For example, ECL input buffer 64 could be disabled instead of ECL decode 66. In the embodiments of FIGS. 9, 10 and 11, PMOS transistor 110 could be replaced by an NMOS transistor, with appropriate changes between PMOS and NMOS transistors elsewhere in the circuit. The voltages could be changed and the entire circuit inverted. Accordingly, the disclosure of the preferred embodiments of the invention is intended to be illustrative, but not limiting, of the scope of the invention which is set forth in the following claims.

What is claimed is:

1. A memory circuit comprising:
    a memory cell;
    means for programming said memory cell by the application of MOS programming voltage levels through a MOS input buffer;
    means for verifying a programmed value on said memory cell with MOS reading voltage levels through a MOS output buffer;
    means for addressing said memory cell with ECL voltage levels through an ECL input buffer; and
    means for reading said memory cell through an ECL output buffer by the application of ECL voltage levels.

2. The memory circuit of claim 1 wherein said memory cell comprises at least one MOS device.

3. The memory circuit of claim 1 wherein said memory cell includes a MOS memory component coupled to said means for programming, and further comprising:
    a sense element having an input coupled to said MOS memory component and an output for providing a sense signal corresponding to a state of the MOS memory component; and
    an ECL pass element including
    a bipolar output transistor coupled to a read bit line, and
    pass means, coupled to a read word line and said sense element output, for activating said bipolar transistor in response to predetermined signals on said read word line and said sense element output.

4. The memory circuit of claim 3 further comprising:
    a separate programming bit line coupled to said memory cell; and a separate programming word line coupled to said memory cell.

5. The memory circuit of claim 4 wherein said bipolar transistor has a collector coupled to said programming word line and an emitter coupled to said read bit line.

6. The memory circuit of claim 4 wherein said MOS memory component comprises:
a first MOS transistor having a first terminal coupled to said programming bit line; and
a capacitor coupled between a gate of said first MOS transistor and said programming word line.

7. The memory circuit of claim 6 wherein said sense element comprises:
a second MOS transistor having a gate coupled to said capacitor and a first output electrode coupled to said pass means; and
a source of current coupled to said output electrode.

8. The memory circuit of claim 7 wherein said source of current comprises a resistor coupled to a voltage reference.

9. The memory circuit of claim 7 wherein said source of current comprises a current source MOS transistor having its gate coupled to a voltage reference, a first electrode coupled to said first output electrode of said second MOS transistor and a second electrode coupled to said programming word line.

10. A memory circuit comprising:
a memory cell;
a read word line coupled to said memory cell;
a programming word line coupled to said memory cell;
a read bit line coupled to said memory cell;
a programming bit line coupled to said memory cell;
an input terminal and an output terminal;
means for reading said memory cell by the application of ECL voltage levels; and
means for programming said memory cell by the application of MOS programming voltage levels, said means for programming including
a MOS input buffer coupled to said input terminal,
a MOS decode circuit coupled between said MOS input buffer and said programming word line,
a MOS sense circuit coupled to said programming bit line,
a MOS output buffer coupled between said MOS sense circuit and said output terminal, and
means for disabling one of said MOS input buffer and said MOS decode circuit.

11. The memory circuit of claim 10 wherein said means for disabling one of said MOS input buffer and said MOS decode circuits comprises first and second NAND gates connected in said MOS input buffer, each of said NAND gates having a first input coupled to said input terminal and a second input coupled to a mode line, an output of said first NAND gate being coupled to a true input line and an output of said second NAND gate being coupled to a complementary input line.

12. A memory circuit comprising:
a memory cell;
a read word line coupled to said memory cell;
a programming word line coupled to said memory cell;
a read bit line coupled to said memory cell;
a programming bit line coupled to said memory cell;
an input terminal and an output terminal;
means for programming said memory cell by the application of MOS programming voltage levels; and
means for reading said memory cell by the application of ECL voltage levels, said means for reading including
an ECL input buffer coupled to said input terminal,
an ECL decode circuit coupled between said ECL input buffer and said read word line,
an ECL sense circuit coupled to said read bit line,
a tri-state ECL output buffer coupled between said ECL sense circuit and said output terminal, and
means for disabling one of said ECL input buffer and said ECL decode circuits.

13. The memory circuit of claim 11 wherein said means for disabling one of said ECL input buffer and said ECL decode circuit comprises a circuit connected inside ECL decode circuit having a transistor for opening a path through said ECL decode circuit, said transistor having its control electrode coupled to a mode line.

14. The memory circuit of claim 11 wherein said tri-state ECL output buffer includes an ECL bipolar output transistor and further comprising means for disabling current flow to the base of said output transistor responsive to a tri-state mode signal.

15. A memory cell capable of programming at MOS programming voltage levels and reading at ECL voltage levels, comprising:
a MOS memory component coupled between a programming word line and a programming bit line;
a sense element having an input coupled to said MOS memory component and an output for providing a sense signal corresponding to a state of MOS memory component; and
an ECL pass element including
a bipolar output transistor coupled to a read bit line, and
pass means, coupled to a read word line and said sense element output, for activating said bipolar transistor in response to predetermined signals on said rear word line and said sense element output.

16. The memory cell of claim 15 wherein said MOS memory component comprises:
a first MOS transistor having a first terminal coupled to said programming bit line; and
a capacitor coupled between a gate of said first MOS transistor and said programming word line.

17. The memory cell of claim 16 wherein said sense element comprises:
a second MOS transistor having a gate coupled to said capacitor and a first output electrode coupled to said pass means; and
a source of current coupled to said output electrode.

18. The memory cell of claim 17 wherein said source of current comprises a resistor coupled to a voltage reference.

19. The memory cell of claim 17 wherein said source of current comprises a current source MOS transistor having its gate coupled to a voltage reference, a first electrode coupled to said first output electrode of said second MOS transistor and a second electrode coupled to said programming word line.

20. A tri-state ECL output buffer comprising:
a bipolar output transistor;
a differential pair of bipolar transistors; and
means for disabling current flow to the base of said output transistor responsive to a tri-state mode signal, including a MOS transistor coupled between said base of said output transistor and an output electrode of one of said differential transistors, the gate of said MOS transistor being coupled to receive said tri-state mode signal.

21. The output buffer of claim 20 wherein said MOS transistor is PMOS transistor and further comprising means, coupled to said base of said output transistor and responsive to said tri-state mode signal, for coupling said base to a voltage reference to ensure said output transistor stays turned off.

22. A tri-state ECL output buffer comprising:
a bipolar output transistor;
a differential pair of bipolar transistors, an output electrode of one of said differential transistors being coupled to a base of said output transistor;
a current source coupled to a second output electrode of each of said differential pair; and
means for disabling current flow to the base of said output transistor responsive to a tri-state mode signal, including
a first MOS transistor coupled to connect the emitter and said base of said output transistor responsive to said tri-state mode signal;
second and third MOS transistors coupled to disable a current supply to the base of each of said differential pair, respectively;
a fourth MOS transistor for disabling, responsive to said tri-state signal, a connection between first output electrodes of said differential pair and a voltage supply;
a fifth MOS transistor coupled to disable said current source responsive to said tri-state signal.

23. A tri-state ECL output buffer comprising:
a first bipolar output transistor;
a differential pair of second and third bipolar transistors, a first output electrode of said second bipolar transistor being coupled to the base of said first bipolar transistor;
a tri-state mode line for receiving a signal to put said output buffer into a high impedance state;
a first MOS transistor coupling the base and emitter of said first bipolar transistor with a gate coupled to said tri-state mode line;
second and third MOS transistors coupled to interrupt a current path to the base of said second and third bipolar transistors, respectively, said second and third MOS transistors each having a gate coupled to said tri-state mode line;
a fourth MOS transistor coupled between said first output electrode of said second bipolar transistor and a voltage supply, with a gate coupled to said tri-state mode line;
a fourth current source bipolar transistor coupled to second output electrodes of said first and second bipolar transistors; and
a fifth MOS transistor coupled between a base of said fourth bipolar transistor and a current source voltage reference.

24. The output buffer of claim 23 wherein said second, third and fourth MOS transistors are PMOS transistors.

25. The output buffer of claim 23 wherein said fifth MOS transistor is an NMOS transistor and further comprising an inverter coupled between the gate of said NMOS transistor and said tri-state mode line.

26. The output buffer of claim 23 further comprising a sense amplifier having fifth and sixth bipolar transistors coupled to the bases of said second and third bipolar transistors, respectively, said second and third MOS transistors being PMOS transistors coupled to the bases of said fifth and sixth bipolar transistor, respectively.

* * * * *